United States Patent
Yang et al.

(10) Patent No.: US 11,302,568 B2
(45) Date of Patent: Apr. 12, 2022

(54) TRENCH SHIELD ISOLATION LAYER

(71) Applicant: TEXAS INSTRUMENTS INCORPORATED, Dallas, TX (US)

(72) Inventors: Hong Yang, Richardson, TX (US); Seetharaman Sridhar, Richardson, TX (US); Ya ping Chen, Chengdu (CN); Fei Ma, Chengdu (CN); Yunlong Liu, Chengdu (CN); Sunglyong Kim, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 16/546,499

(22) Filed: Aug. 21, 2019

(65) Prior Publication Data

US 2020/0312710 A1    Oct. 1, 2020

Related U.S. Application Data

(63) Continuation of application No. PCT/CN2019/080340, filed on Mar. 29, 2019.

(51) Int. Cl.
*H01L 21/762* (2006.01)
*H01L 21/763* (2006.01)
(Continued)

(52) U.S. Cl.
CPC .. *H01L 21/76235* (2013.01); *H01L 21/02164* (2013.01); *H01L 21/308* (2013.01);
(Continued)

(58) Field of Classification Search
None
See application file for complete search history.

(56) References Cited

U.S. PATENT DOCUMENTS 6,649,535 B1 * 11/2003  Yu ............... H01L 21/02255
                                                    438/763
8,642,425 B2    2/2014  Burke et al.
(Continued)

FOREIGN PATENT DOCUMENTS

CN    102130169 A    7/2011
CN    102610568 A    7/2012
(Continued)

OTHER PUBLICATIONS

Patent Cooperation Treaty International Search Report, dated Jan. 2, 2020, Applicant: Texas Instruments Incorporated et al., PCT/CN2019/080340.

*Primary Examiner* — Xiaoming Liu
(74) *Attorney, Agent, or Firm* — Jacqueline J. Garner; Charles A. Brill; Frank D. Cimino

(57) ABSTRACT

A semiconductor device has a semiconductor material in a substrate. The semiconductor device has an MOS transistor. A trench in the substrate extends from a top surface of the substrate) into the semiconductor material. A shield is disposed in the trench. The shield has a contact portion which extends toward a top surface of the trench. A gate of the MOS transistor is disposed in the trench over the shield. The gate is electrically isolated from the shield. The gate is electrically isolated from the contact portion of the shield by a shield isolation layer which covers an angled surface of the contact portion extending toward the top of the trench. Methods of forming the semiconductor device are disclosed.

18 Claims, 17 Drawing Sheets

(51) Int. Cl.
*H01L 21/308* (2006.01)
*H01L 29/66* (2006.01)
*H01L 21/02* (2006.01)
*H01L 21/324* (2006.01)

(52) U.S. Cl.
CPC .......... *H01L 21/324* (2013.01); *H01L 21/763* (2013.01); *H01L 21/76283* (2013.01); *H01L 21/76286* (2013.01); *H01L 29/66666* (2013.01)

(56) References Cited

U.S. PATENT DOCUMENTS

| | | | |
|---|---|---|---|
| 9,299,830 B1* | 3/2016 | Kawahara | H01L 29/404 |
| 2009/0007962 A1* | 1/2009 | Wenham | H01L 31/022425 |
| | | | 136/256 |

FOREIGN PATENT DOCUMENTS

| | | |
|---|---|---|
| CN | 103887342 A | 6/2014 |
| CN | 104022043 A | 9/2014 |
| CN | 109216452 A | 1/2019 |

* cited by examiner

TRENCH SHIELD ISOLATION LAYER

FIELD

This disclosure relates to the field of semiconductor devices. More particularly, this disclosure relates to isolation layers in microelectronic devices/integrated circuits/semiconductor devices.

BACKGROUND

Some semiconductor devices include a transistor with a gate in a trench in the semiconductor substrate, and a shield in the trench below the gate. Such a configuration is common in vertical metal oxide semiconductor (MOS) transistors. A portion of the shield extends to a top of the trench, to provide an area for an electrical connection to the shield. Forming the shield and the gate to be electrically isolated from each other, while maintaining the size of the transistor below a target size, has been difficult to achieve in production.

SUMMARY

The present disclosure introduces a semiconductor device which includes a metal oxide semiconductor (MOS) transistor having a trench in a substrate. The substrate includes a semiconductor material extending to the trench. A shield is disposed in the trench. A contact portion of the shield extends toward a top surface of the trench. A gate is disposed in the trench over the shield. The gate is electrically isolated from the shield. The gate is electrically isolated from the contact portion of the shield by a shield isolation layer which covers an angled surface of the shield contact portion extending toward the top of the trench. The semiconductor device is formed by removing at least a portion of a shield liner in the trench in a region for the gate, and forming the shield isolation layer on the surface of the shield extending toward the top of the trench, prior to forming the gate.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device has a trench in a substrate. The substrate includes a semiconductor material, which extends to the trench. The semiconductor device includes a metal oxide semiconductor (MOS) transistor. A shield of the MOS transistor is disposed in the trench, along a bottom of the trench and extending toward a top of the trench, for example, at an end of the trench. The shield is separated from the semiconductor material of the substrate by a shield liner which is electrically non-conductive. An electrical connection to the shield may be located at the top of the trench, where the shield extends toward the top of the trench. The shield has an angled surface where the shield extends toward the top of the trench. A gate of the MOS transistor is disposed in the trench, over the shield. The gate is separated from the angled surface of the shield by a shield isolation layer which includes a dielectric material.

The semiconductor device is formed by forming the shield liner in the trench, and forming the shield on the shield liner, extending to a top of the trench. A portion of the shield is removed from the trench, leaving the shield extending along a bottom of the trench, and extending toward the top of the trench with the angled surface. At least a portion of the trench liner is removed where exposed by the shield. A shield isolation layer is formed on the shield, covering the angled surface of the shield that extends toward the top of the trench. The gate is formed in the trench, so that the gate is separated from the angled surface of the shield by the shield isolation layer.

It is noted that terms such as top, bottom, over, and below may be used in this disclosure. These terms should not be construed as limiting the position or orientation of a structure or element, but should be used to provide spatial relationship between structures or elements.

Figure 1:
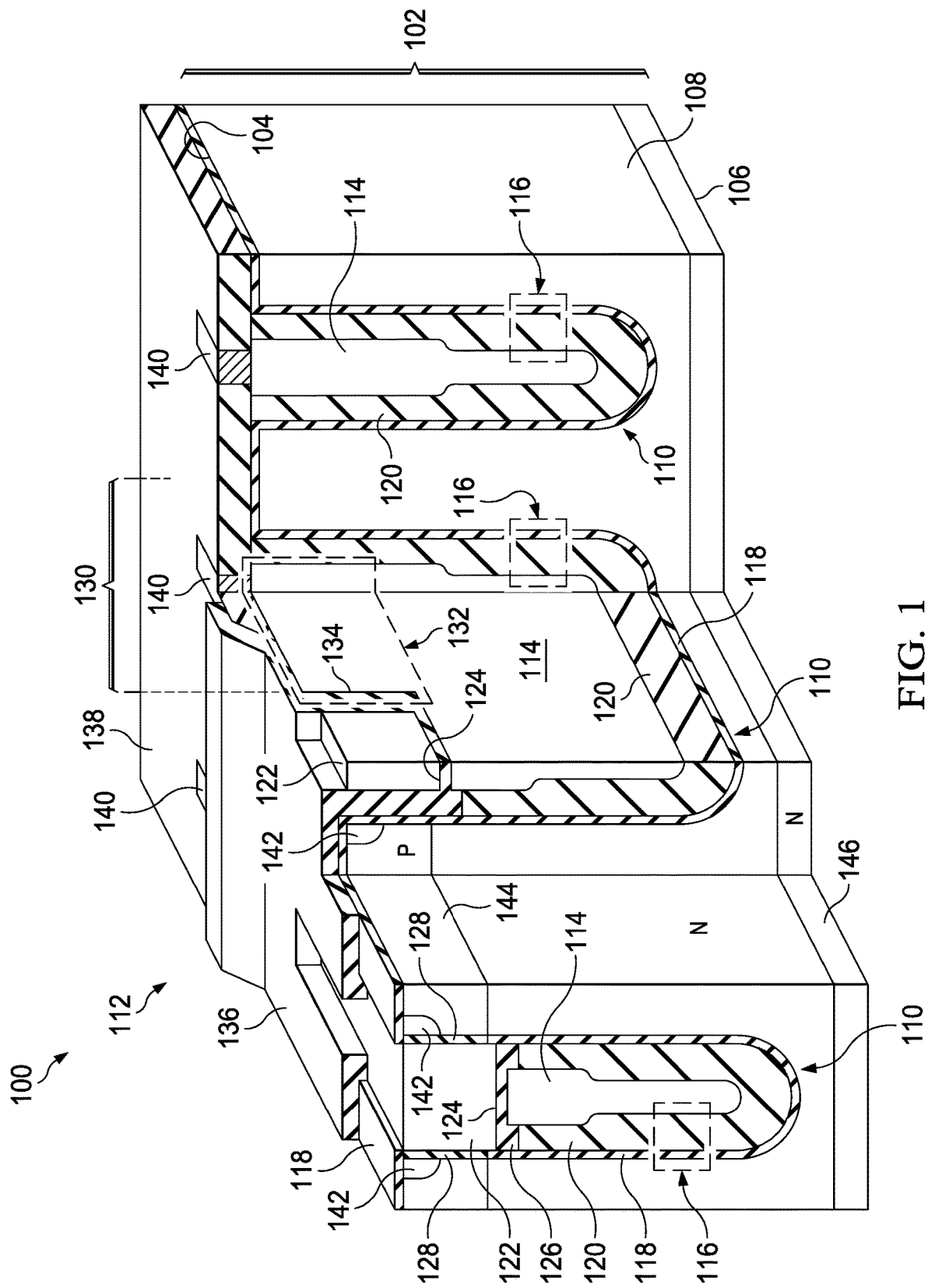
FIG. 1 is a cross section of an example semiconductor device with a shield and a gate separated by a shield isolation layer.

FIG. 1 is a cross section of an example semiconductor device with a shield and a gate separated by a shield isolation layer. The semiconductor device 100 includes a substrate 102 having a top surface 104 and a bottom surface 106, located opposite from the top surface 104. The substrate 102 includes a semiconductor material 108, such as silicon. The semiconductor material 108 may extend from the top surface 104 to the bottom surface 106, as depicted in FIG. 1. The substrate 102 has one or more trenches 110 extending from the top surface 104 into the semiconductor material 108. References in the singular tense include the plural, and vice versa, unless otherwise noted. The trenches 110 may optionally be connected at a point not shown in FIG. 1, to provide a single trench 110. The semiconductor material 108 extends to the trenches 110. The trenches 110 may be 0.5 microns to 2 microns wide, for example, and may have ratios of depth to width, referred to as aspect ratios, of 3:1 to 10:1, for example.

The semiconductor device 100 includes an MOS transistor 112. The MOS transistor 112 includes a shield 114 disposed in the trenches 110. The shield 114 is electrically conductive, and may include, for example, polycrystalline silicon, sometime referred to as polysilicon. The polycrystalline silicon may be doped during deposition, or may be implanted with dopants after deposition, to reduce an electrical resistivity of the shield 114. The shield 114 is separated from the semiconductor material 108 by a shield liner 116 which is electrically non-conductive. In this example, the shield liner 116 may include a first liner 118 of thermal silicon dioxide, contacting the semiconductor material 108, and a second liner 120 of a deposited dielectric material, contacting the first liner 118. The thermal silicon dioxide in the first liner 118 may be characterized by a stoichiometric composition of silicon dioxide, that is, $SiO_2$, and a hydrogen content less than 5 atomic percent. The first liner 118 may have a thickness of 20 nanometers to 200 nanometers in the trenches 110, for example. The first liner 118 may optionally extend over the top surface 104 of the substrate 102, as indicated in FIG. 1. The second liner 120 may include silicon dioxide, and may have an etch rate, in aqueous buffered hydrofluoric acid, that is at least twice an etch rate, in the same aqueous buffered hydrofluoric acid, of the first liner 118. The shield liner 116 may vary in thickness, having a higher thickness proximate to a bottom of the shield 114 than proximate to a top of the shield 114. By way of example, the shield liner 116 may have a thickness of 200 nanometers to 400 nanometers proximate to the bottom of the shield 114, and may have a thickness of 60 nanometers to 200 nanometers proximate to the top of the shield 114. Having a varying thickness of the shield liner 116 may advantageously reduce an electric field in the semiconductor material 108 between the trenches 110 during operation of the MOS transistor 112. The term "proximate to" is understood in this context to refer to a vertical distance that is less than a lateral width of the trenches 110. The terms "lateral" and "laterally" refer to a direction parallel to the top surface 104 of the substrate 102. The terms "vertical" and "vertically" refer to a direction perpendicular to the top surface 104.

The MOS transistor 112 includes a gate 122 in the trenches 110. The shield 114 extends under the gate 122 in the trenches 110. The gate 122 may include polycrystalline silicon, for example, with appropriate dopants to attain a desired threshold potential during operation of the MOS transistor 112. A gate bottom surface 124 of the gate 122 is separated from the shield 114 by a lateral insulator 126. The lateral insulator 126 may include silicon dioxide, for example. The gate 122 extends to proximate to a top of the trenches 110, that is, proximate to the top surface 104 of the substrate 102. Proximate to the top surface 104, in this example, is understood to mean a vertical distance between a top of the gate 122 and the top surface 104 is less than a lateral width of one of the trenches 110. The gate 122 is separated from the semiconductor material 108 by a gate dielectric layer 128, which contacts the gate 122 and the semiconductor material 108.

One or more contact portions 132 of the shield 114 extend toward the top of that trench 110, that is, toward the top surface 104. The contact portions 132 of the shield 114 may be located, for example, at ends 130 of the trenches 110. The contact portion 132 of the shield 114 has an angled surface 134 adjacent to the gate 122 that extends from below the gate bottom surface 124 to proximate to the top of the trench 110. A plane of the angled surface 134 intersects the top surface 104 of the substrate 102 at an angle of 45 degrees to 90 degrees, with 90 degrees being perpendicular to the top surface 104. The angled surface 134 of the contact portion 132 of the shield 114 is separated from the gate 122 by a shield isolation layer 136, which is electrically non-conductive. The shield isolation layer 136 contacts the gate 122 and the angled surface 134 of the contact portion 132 of the shield 114. The shield isolation layer 136 may extend laterally between the gate bottom surface 124 and the shield 114 for a distance sufficient to provide complete coverage of the angled surface 134 of the contact portion 132 of the shield 114, but does not extend a length of each of the trenches 110. By way of example, the shield isolation layer 136 may extend laterally between the gate bottom surface 124 and the shield 114 for 1 micron to 5 microns. The shield isolation layer 136 may include silicon dioxide, with a hydrogen content less than 15 atomic percent. The shield isolation layer 136 may extend over the top surface 104 of the substrate, as shown in FIG. 1. The shield isolation layer 136 may be 100 nanometers to 300 nanometers thick, for example. The shield isolation layer 136 may advantageously reduce leakage current between the gate 122 and the contact portion 132 of the shield 114 during operation of the MOS transistor 112, compared to relying on an extension of the gate dielectric layer 128 to isolate the gate 122 from the contact portion 132 of the shield 114.

The shield isolation layer 136 may extend onto a top dielectric layer 138. The top dielectric layer 138 may include silicon dioxide, and may be 300 nanometers to 1 micron thick, for example. An edge of the top dielectric layer 138 adjacent to the contact portion 132 of the shield 114 may be tapered, as depicted in FIG. 1. Contacts 140 may extend through the top dielectric layer 138 to provide electrical connections to the contact portion 132 of the shield 114.

The MOS transistor 112 of this example includes a source 142 in the semiconductor material 108, contacting the gate dielectric layer 128. The source 142 has a first conductivity type, for example, n-type. The MOS transistor 112 of this example includes a body 144 in the semiconductor material 108, contacting the gate dielectric layer 128 and the source 142. The body 144 has a second conductivity type, opposite from the first conductivity type; in this example, the body 144 may be p-type, as indicated in FIG. 1. The MOS transistor 112 of this example includes a drain contact region 146 in the semiconductor material 108 below the trenches 110, extending to the bottom surface 106 of the substrate 102. The drain contact region 146 has the first conductivity type, which is n-type in this example, as indicated in FIG. 1. The semiconductor material 108 between the body 144 and the drain contact region 146 may have the first conductivity type, n-type in this example, and may provide a drain drift region for the MOS transistor 112.

Figure 2A:
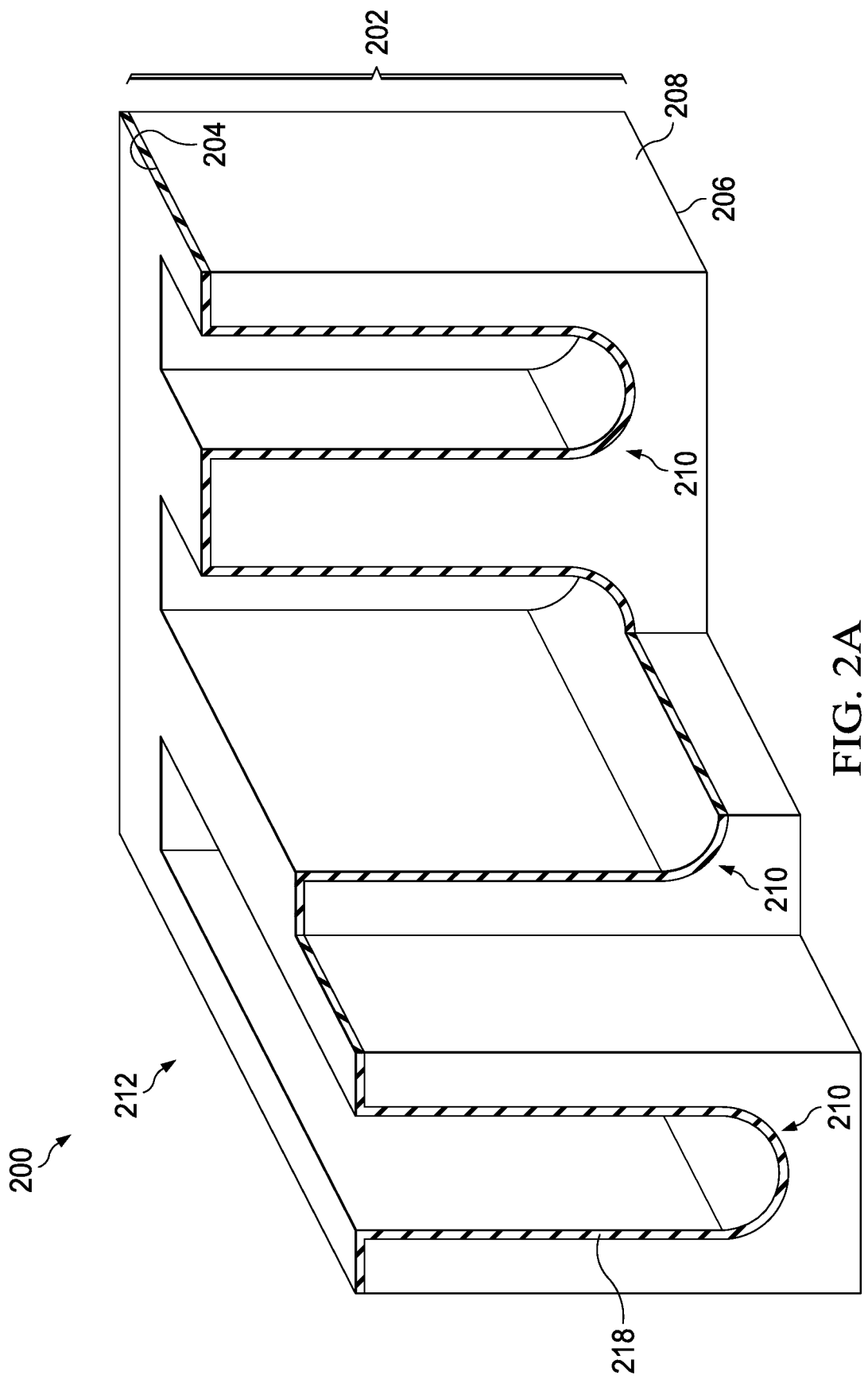
FIG. 2A through FIG. 2N are cross sections of a semiconductor device with a shield and a gate separated by a shield isolation layer, depicted in stages of an example method of formation.
Figure 2B:
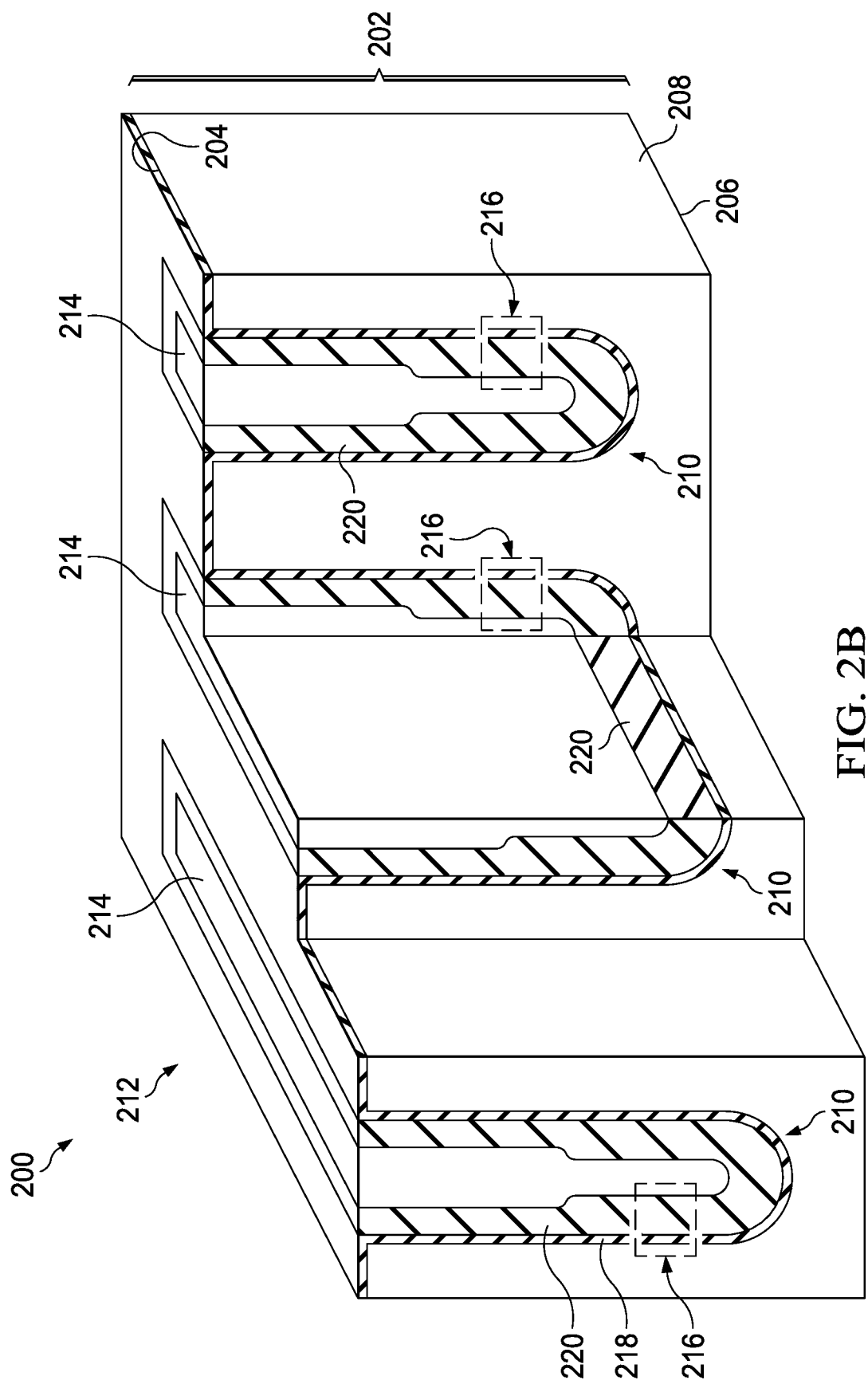
Figure 2C:
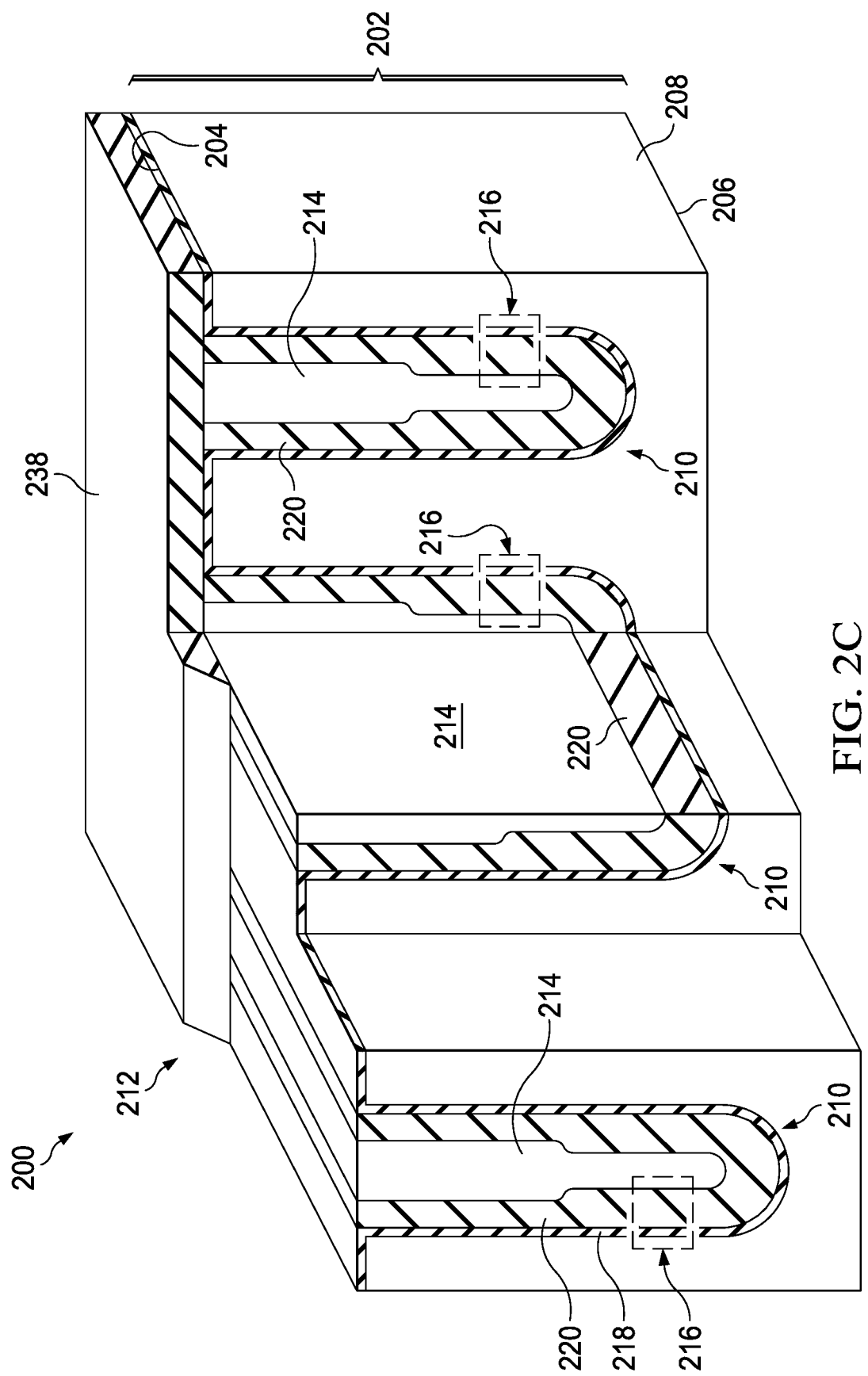
Figure 2D:
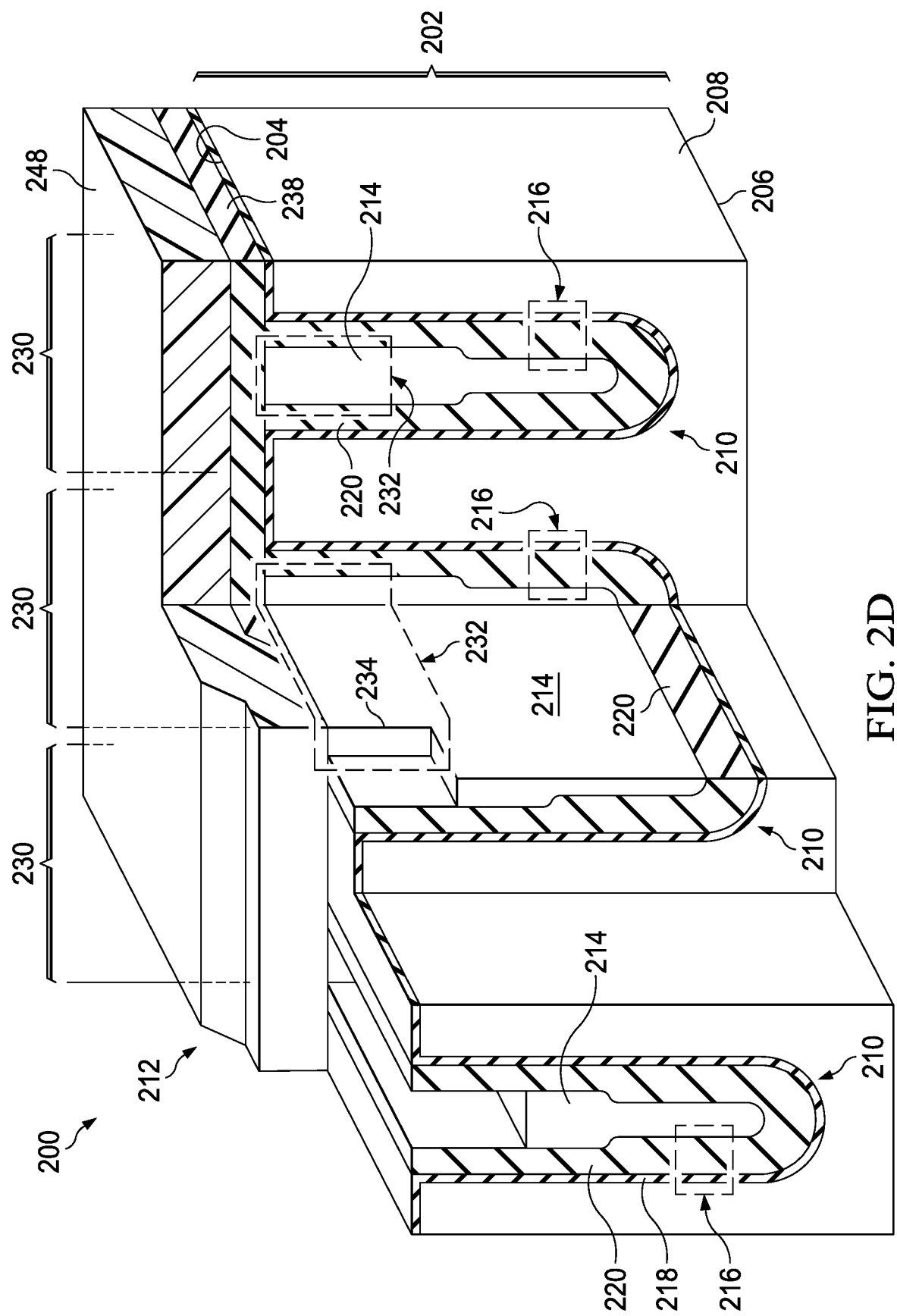
Figure 2E:
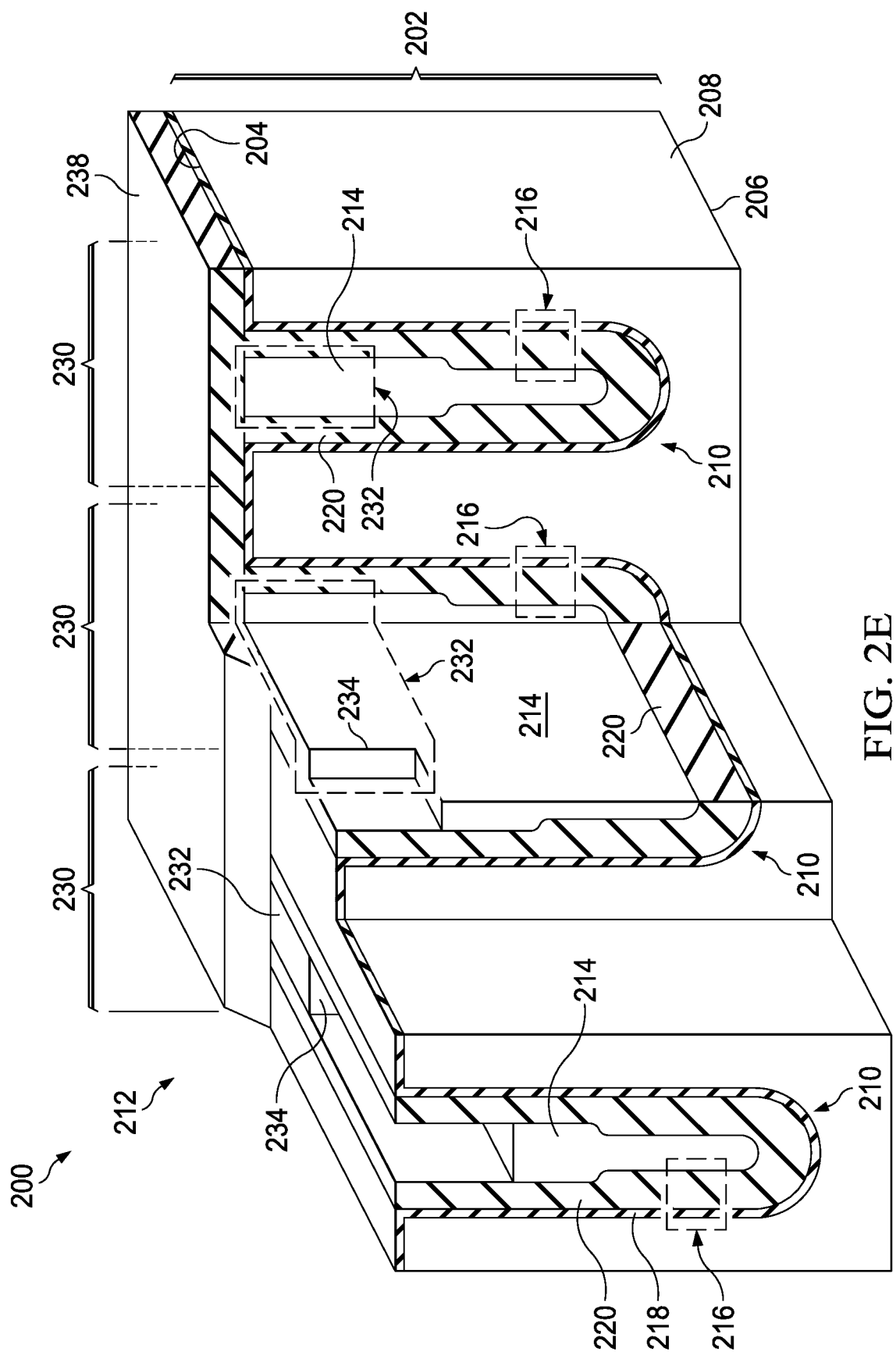
Figure 2F:
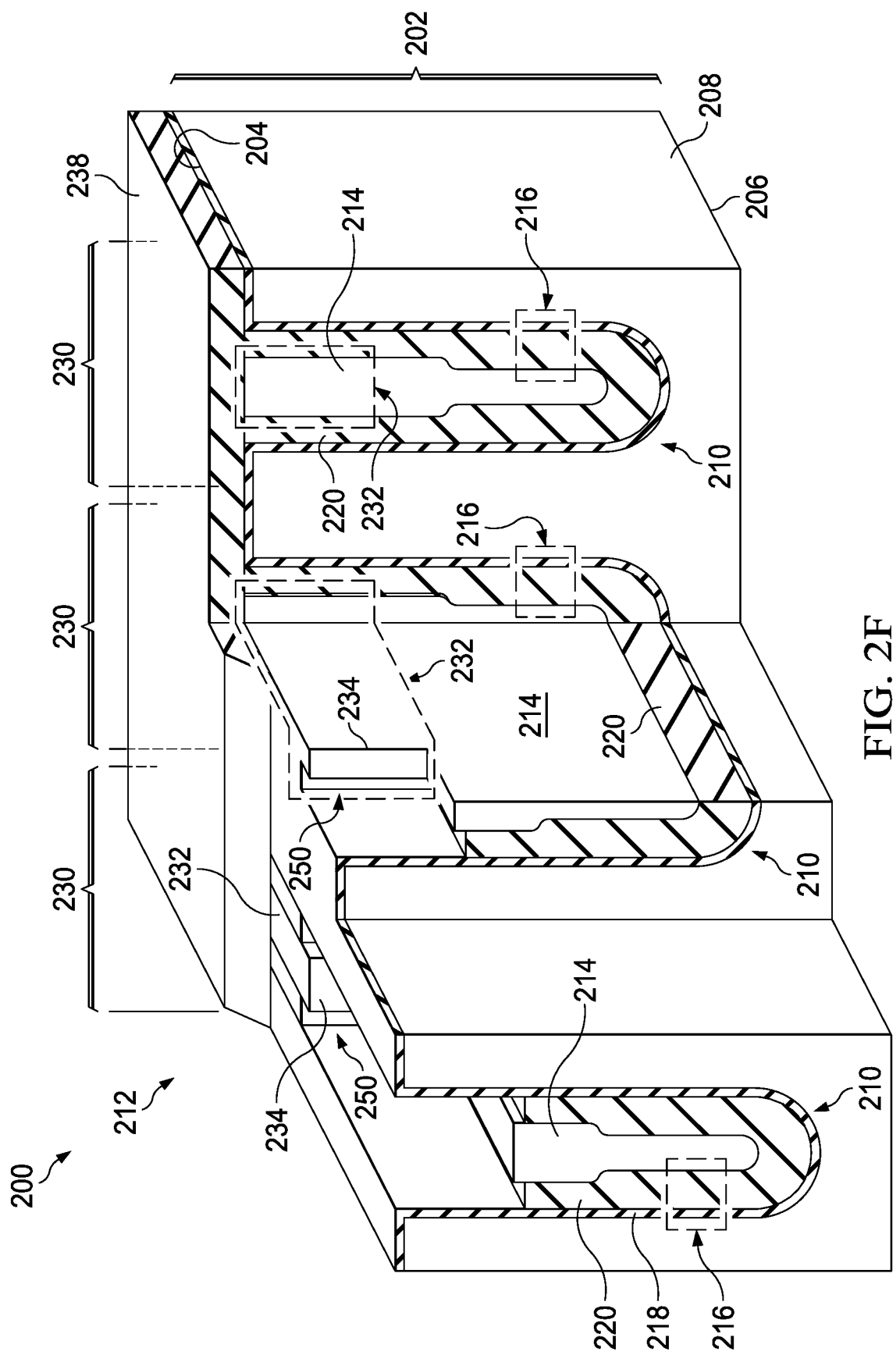
Figure 2G:
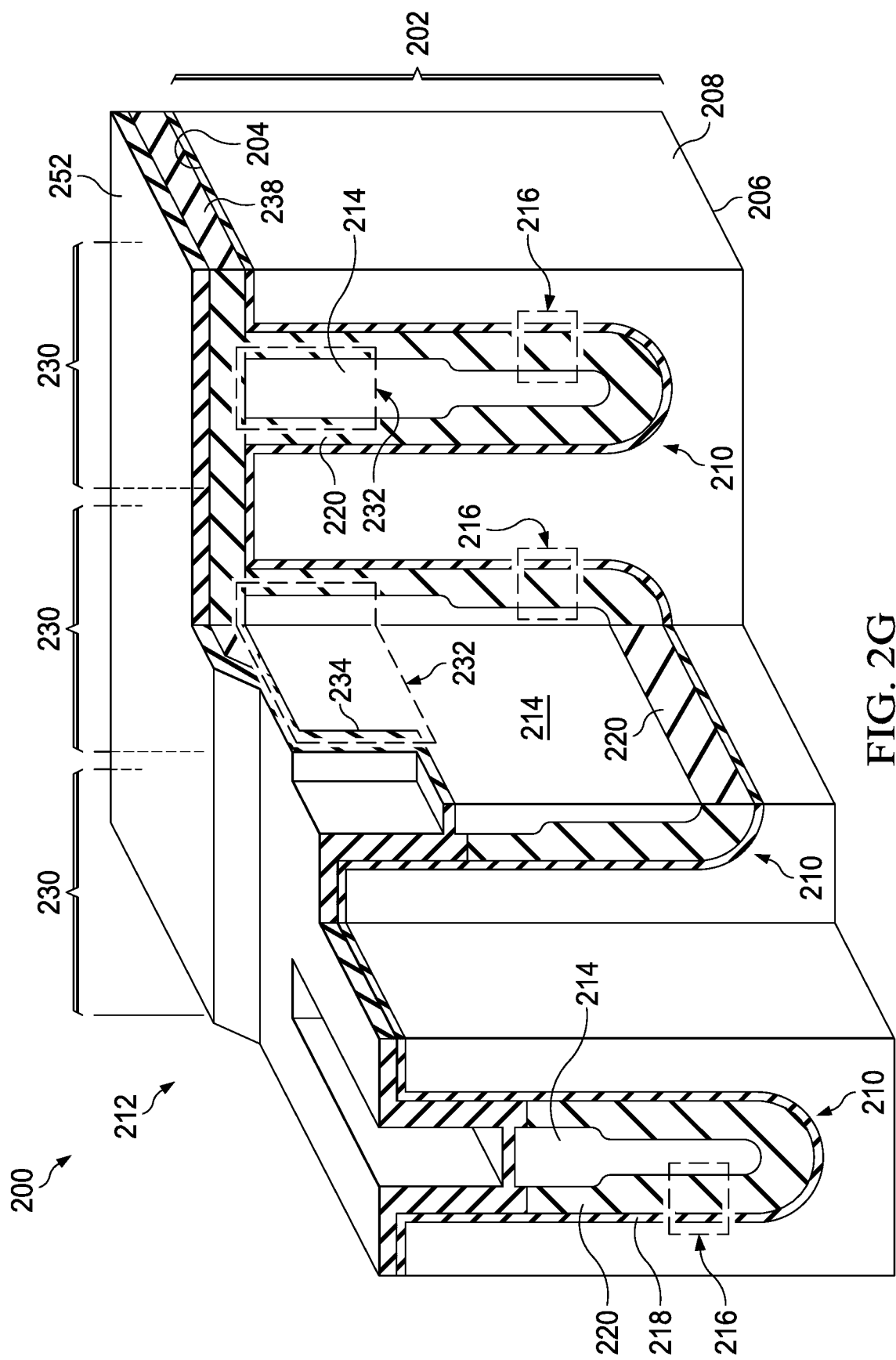
Figure 2H:
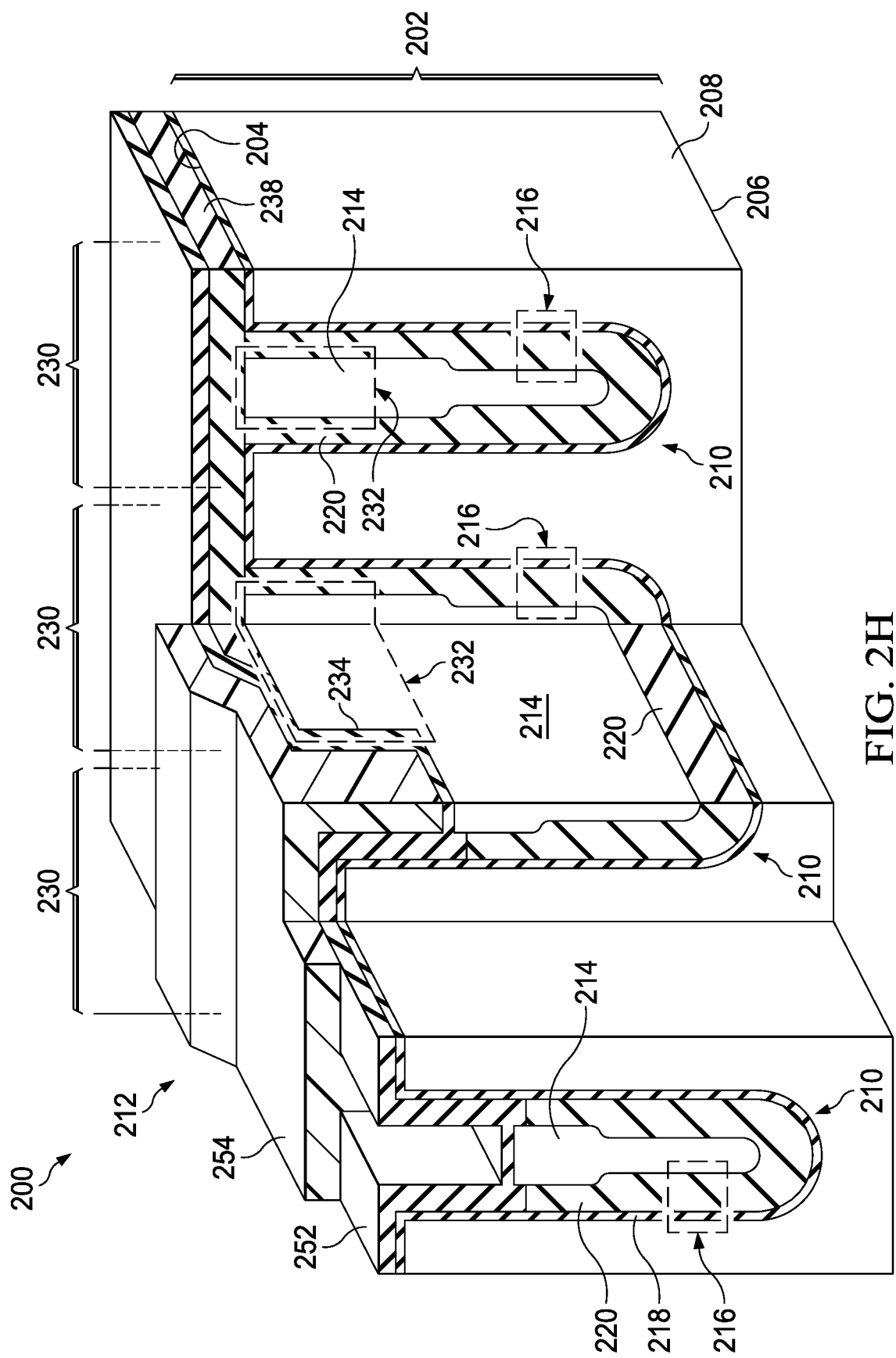
Figure 2I:
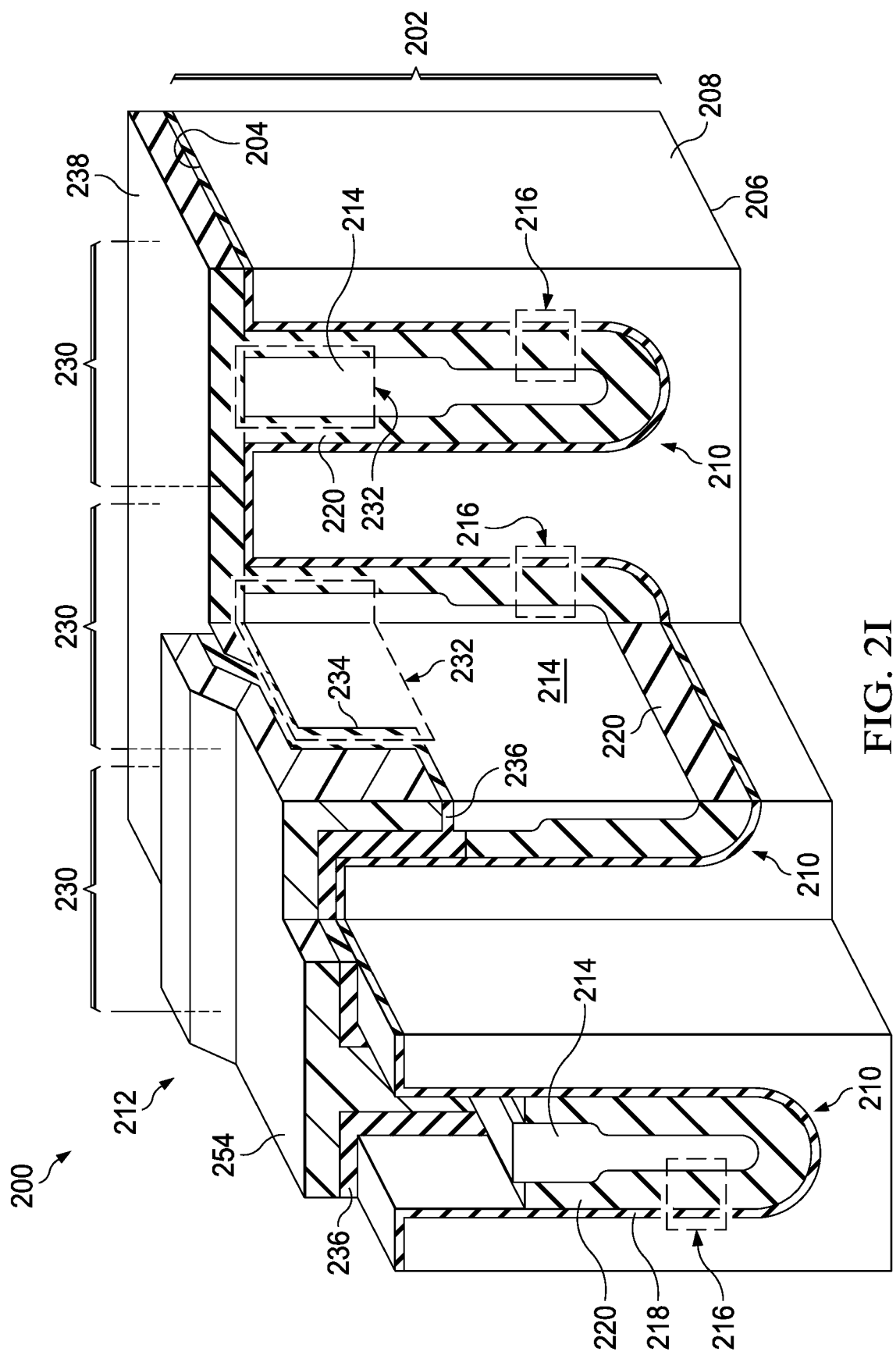
Figure 2J:
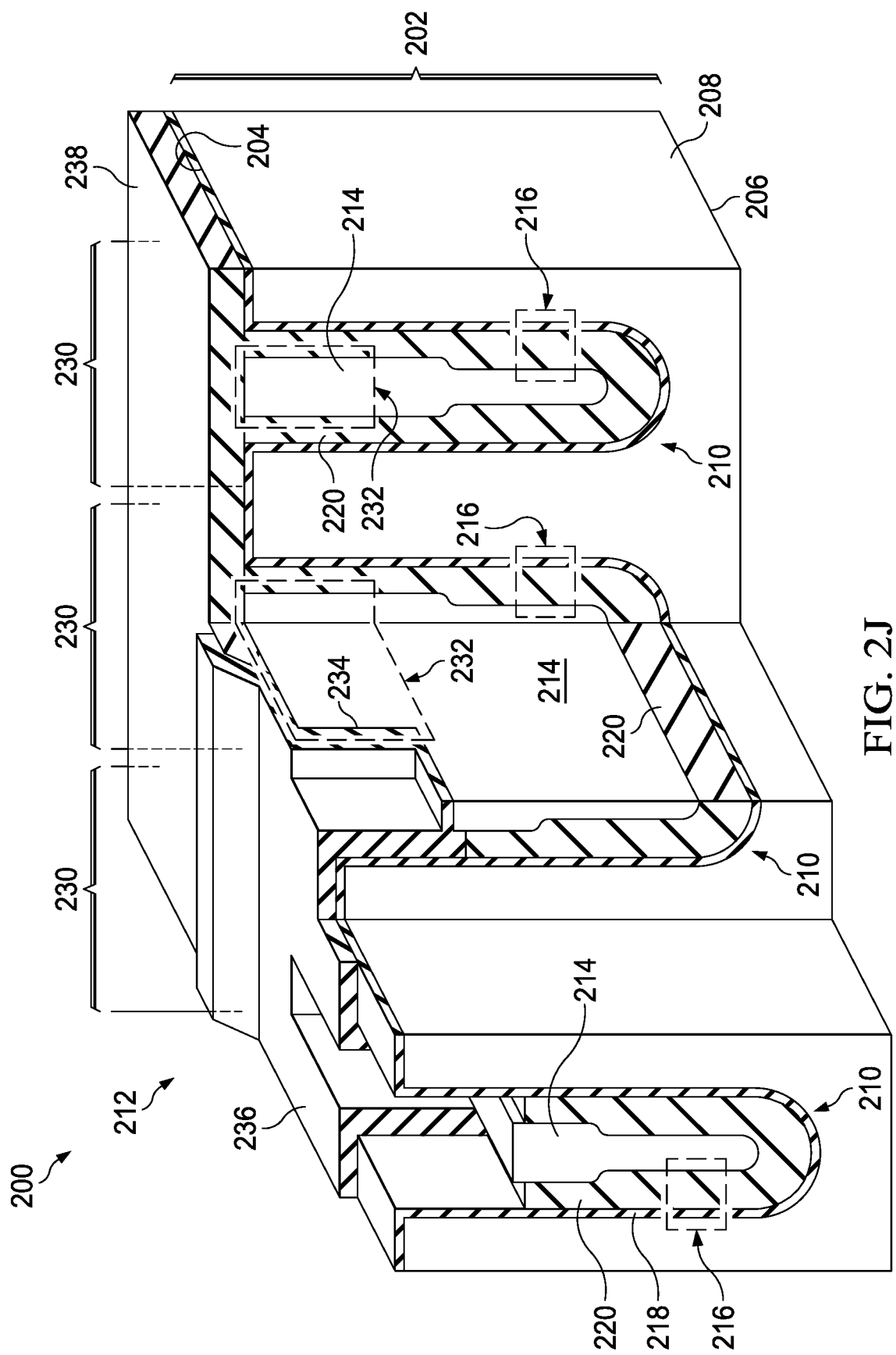
Figure 2K:
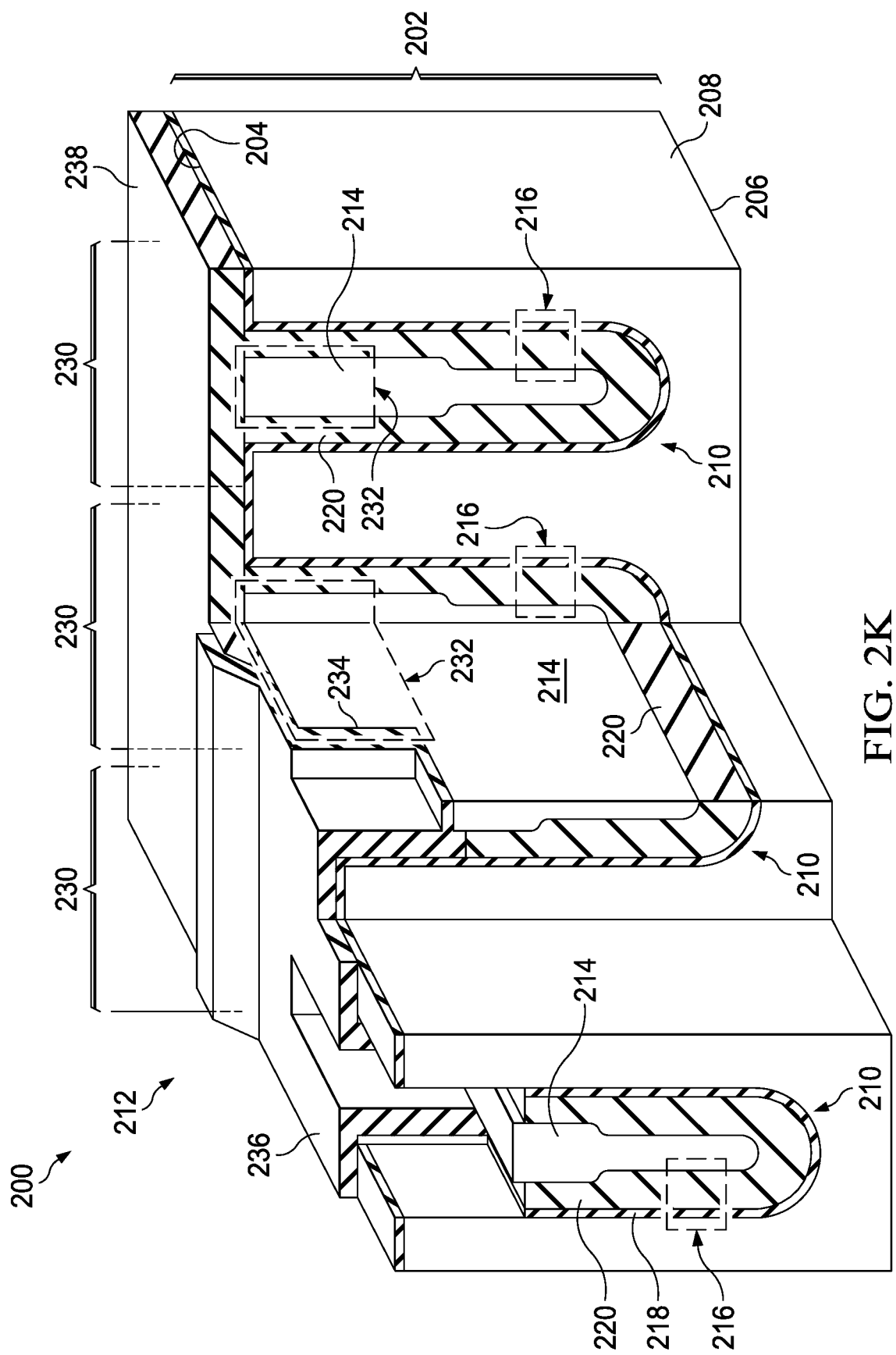
Figure 2L:
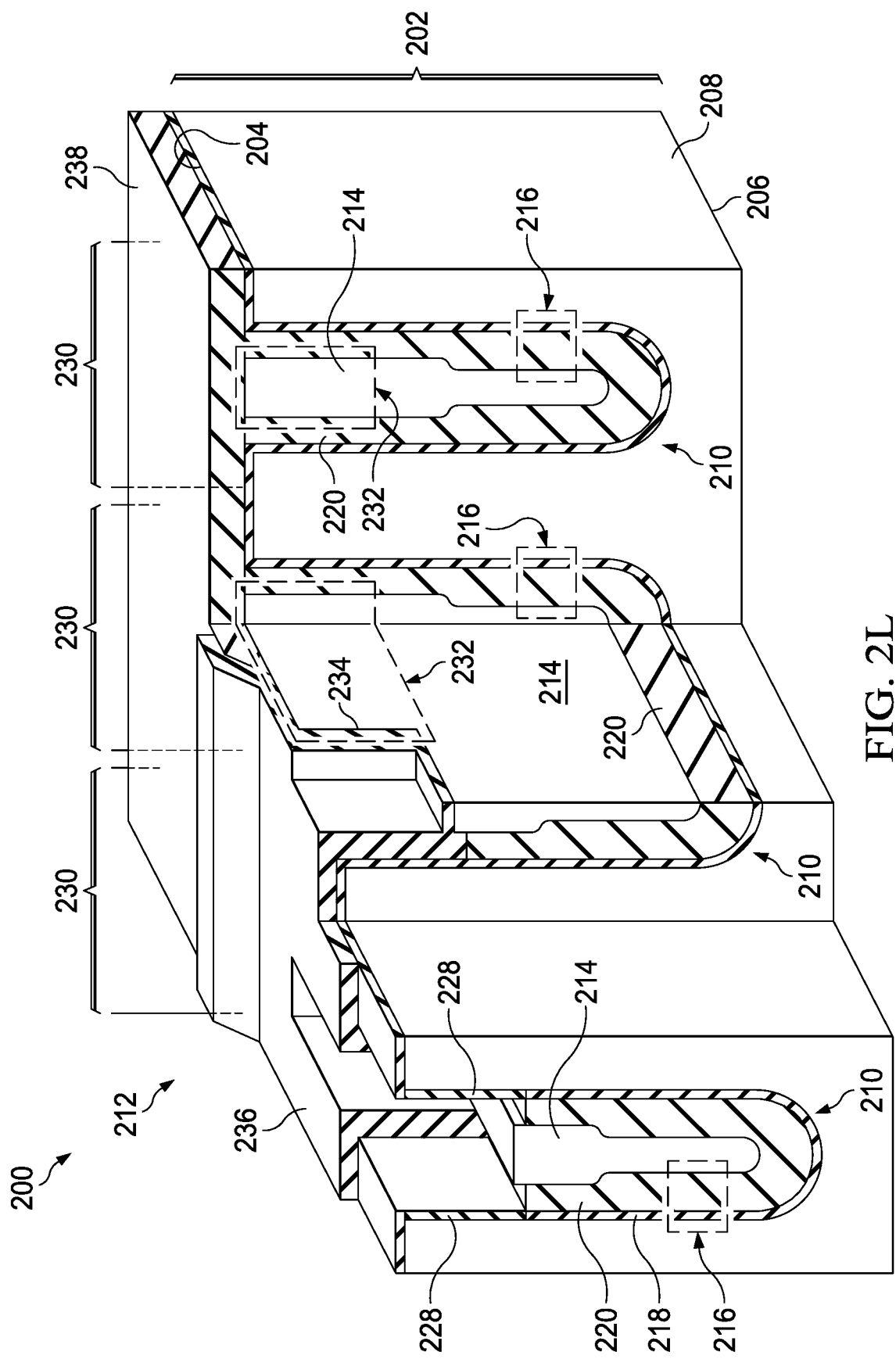
Figure 2M:
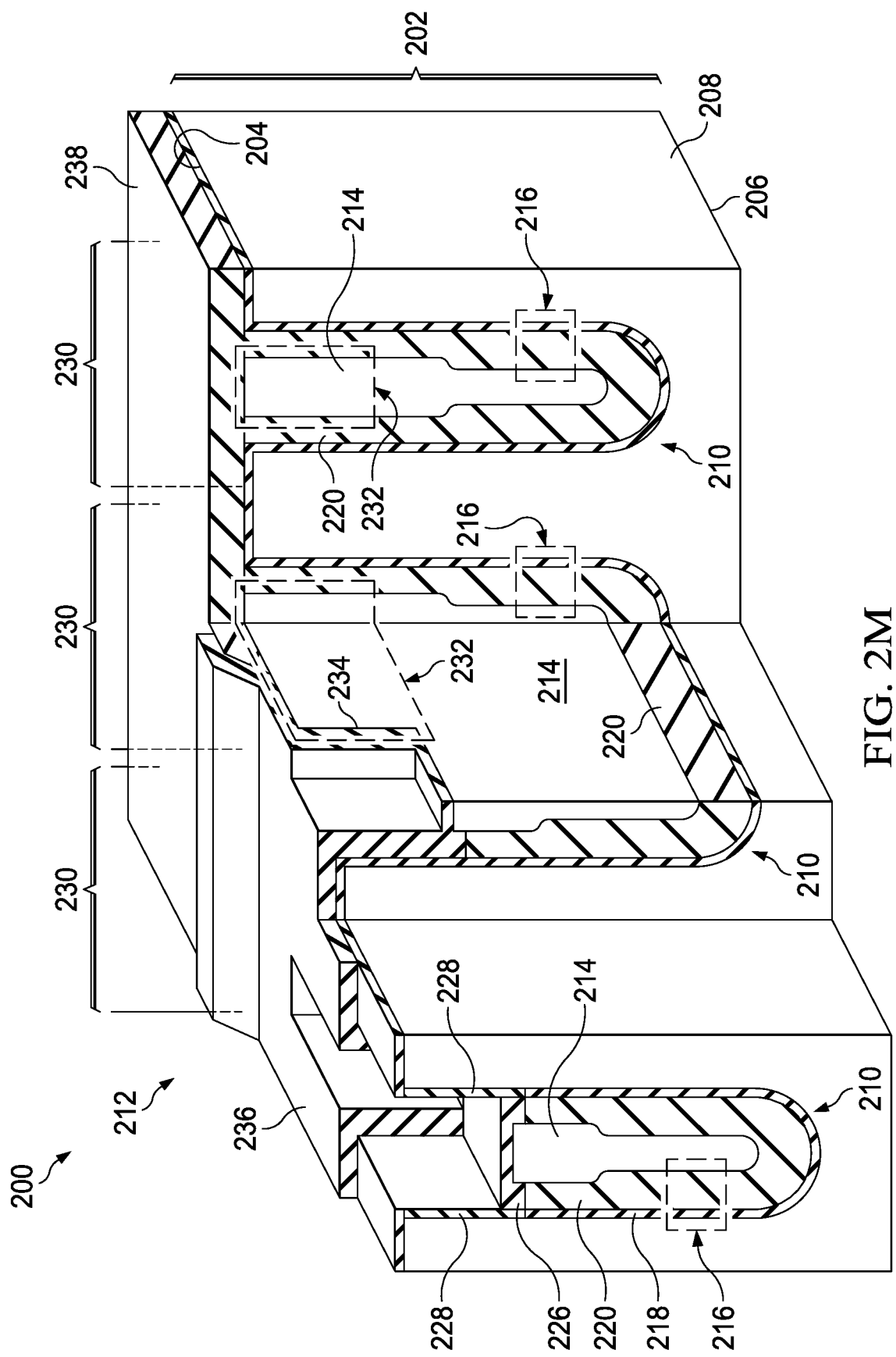
Figure 2N:
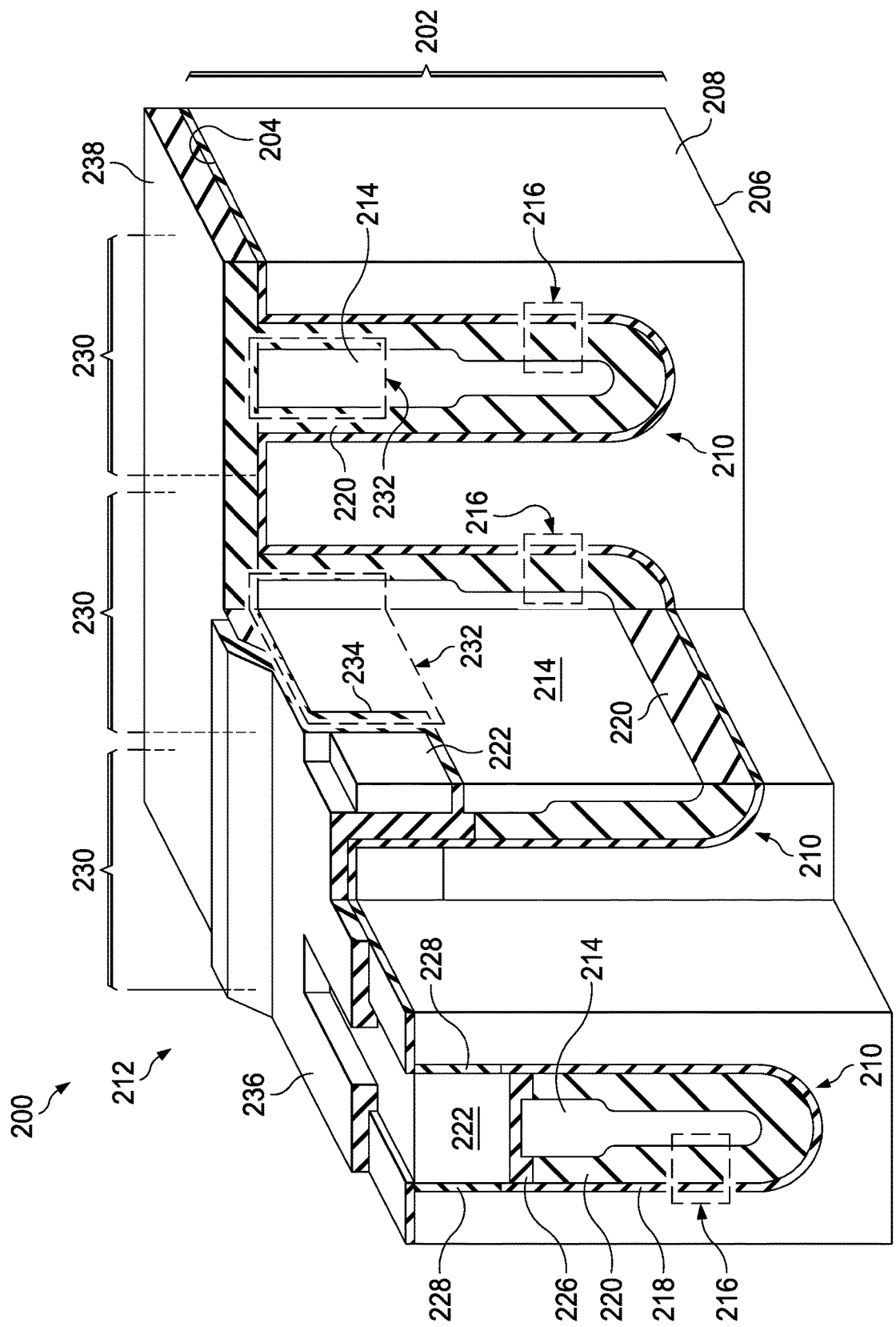

FIG. 2A through FIG. 2N are cross sections of a semiconductor device with a shield and a gate separated by a shield isolation layer, depicted in stages of an example method of formation. Referring to FIG. 2A, formation of the semiconductor device 200 includes acquiring a substrate 202. The substrate 202 may be implemented as a semiconductor wafer, such as a silicon wafer, optionally with an epitaxial layer, for example. The substrate 202 has a top surface 204 and a bottom surface 206 located opposite from the top surface 204. The substrate 202 includes a semiconductor material 208, such as silicon. The semiconductor material 208 may extend from the top surface 204 to the bottom surface 206, as depicted in FIG. 2A.

The substrate 202 includes an area for an MOS transistor 212. In the area for the MOS transistor 212, one or more trenches 210 are formed in the substrate 202. The trenches 210 extend from the top surface 204 into the semiconductor material 208. The one or more trenches 210 may optionally be connected at a point not shown in FIG. 2A, to provide a single trench 210. The trenches 210 may extend to proximate to the bottom surface 206 of the substrate 202, as depicted in FIG. 2A. Alternatively, the trenches 210 may extend through the semiconductor material 208 to the bottom surface 206. The trenches 210 may be 0.5 microns to 2 microns wide, for example, and may have aspect ratios of 3:1 to 10:1, for example.

A first liner 218 is formed on the semiconductor material 208 in the trenches 210. The first liner 218 of this example is formed by a thermal oxidation process at a temperature above 800° C., so that the first liner 218 includes primarily thermal silicon dioxide having a stoichiometric composition of silicon dioxide, that is, SiO2, and a hydrogen content less than 5 atomic percent. The first liner 218 may have a thickness of 20 nanometers to 200 nanometers in the trenches 210, for example. The first liner 218 may extend over the top surface 204 of the substrate 202, as depicted in FIG. 2A.

Referring to FIG. 2B, a second liner 220 is formed on the trenches 210 on the first liner 218. The second liner 220 may be formed by a thermal chemical vapor deposition (CVD) process using tetraethyl orthosilicate (TEOS), Si(OC$_2$H$_5$)$_4$, sometimes referred to as tetraethoxysilane. The thermal CVD process may be implemented as a sub-atmospheric chemical vapor deposition (SACVD) process, for example, or as an atmospheric pressure chemical vapor deposition (APCVD) process. Alternatively, the second liner 220 may be formed by a plasma enhanced chemical vapor deposition (PECVD) process, using TEOS. The second liner 220 includes primarily silicon dioxide. The second liner 220 is formed at a temperature sufficiently low so that the second liner 220 has an etch rate, in aqueous buffered hydrofluoric acid, that is at least twice an etch rate, in the same aqueous buffered hydrofluoric acid, of the first liner 218. By way of example, the second liner 220 may be formed below 600° C. The second liner 220 may be formed to have a greater thickness proximate to bottoms of the trenches 210 that proximate to tops of the trenches 210, as depicted in FIG. 2B. The second liner 220 may be formed in two or more steps to attain a desired thickness profile in the trenches 210. The second liner 220 may be removed from over the top surface 204 of the substrate 202, as indicated in FIG. 2B, or may extend over the top surface 204, similarly to the first liner 218. A combination of the first liner 218 and the second liner 220 provides a shield liner 216 in the trenches 210.

A shield 214 is formed in the trenches 210 on the shield liner 216, extending to proximate to the top surface 204 of the substrate 202. The shield 214 is electrically conductive, and is electrically isolated from the semiconductor material 208 by the shield liner 216. The shield 214 may be formed by thermal or plasma decomposition of silane or disilane, so that the shield 214 may include primarily polycrystalline silicon. The shield 214 may be formed at a temperature that is sufficiently low so as to maintain the etch rate of the second liner 220, in aqueous buffered hydrofluoric acid, above twice the etch rate of the first liner 218. By way of one example, the shield 214 may be formed of undoped polycrystalline silicon at 600° C. to 620° C., and subsequently implanted with dopants and annealed to provide a desired electrical resistivity in the shield 214. By way of another example, the shield 214 may be formed of doped polycrystalline silicon at 500° C. to 580° C. by including dopant reagents with the silane or disilane.

Referring to FIG. 2C, a top dielectric layer 238 is formed over the top surface 204 of the substrate 202. The top dielectric layer 238 is patterned to expose the shield 214 in the trenches 210. The top dielectric layer 238 may include silicon dioxide, and may be 300 nanometers to 1 micron thick, for example. The top dielectric layer 238 may be formed by a thermal CVD process using TEOS, or by a PECVD process using TEOS, at a temperature that is sufficiently low so as to maintain the etch rate of the second liner 220, in aqueous buffered hydrofluoric acid, above twice the etch rate of the first liner 218. An edge of the top dielectric layer 238 adjacent to the shield 214 may be tapered, as depicted in FIG. 2C, using an erodable etch mask, and etching the top dielectric layer 238 using an isotropic plasma etch process.

Referring to FIG. 2D, a shield etch mask 248 is formed over the top surface 204 of the substrate 202, covering one or more contact portions 232 of the shield 214, which may be located, for example, at ends 230 of the trenches 210, and exposing the shield 214 past the contact portion 232. The shield etch mask 248 may include photoresist, and may be formed by a photolithographic process. The shield etch mask 248 may include hard mask materials, such as silicon nitride or amorphous carbon. In an alternate version of this example, the shield etch mask 248 may be used to provide an etch mask for both the top dielectric layer 238 and the shield 214, advantageously reducing fabrication cost and complexity of the semiconductor device 200.

A portion of the shield 214 is removed where exposed by the shield etch mask 248, leaving the shield 214 along a bottom portion of the trenches 210. The portion of the shield 214 may be removed by a reactive ion etch (RIE) process using chlorine or bromine. The portion of the shield 214 may be removed by a timed etch process, to remove a desired amount of the shield 214. The process of removing the portion of the shield 214 leaves the contact portion 232 with an angled surface 234 extending proximate to the top surface 204 of the substrate 202. The process of removing the portion of the shield 214 also leaves at least a portion of the shield liner 216 in the trenches 210, extending to the top surface 204, as depicted in FIG. 2D.

Referring to FIG. 2E, the shield etch mask 248 of FIG. 2D is removed. The shield etch mask 248 may be removed by an oxygen plasma process, such as an asher process or a downstream asher process, or an ozone process, followed by a wet clean process using an aqueous mixture of sulfuric acid and hydrogen peroxide. Other methods for removing the shield etch mask 248 are within the scope of this example. The shield etch mask 248 may be used to provide an etch mask for the top dielectric layer 238, before being removed, as noted above.

Referring to FIG. 2F, the second liner 220 is removed from the trenches 210 where exposed by the shield 214. The second liner 220 may be removed by a wet etch using an aqueous solution of buffered hydrofluoric acid, for example a 1 percent solution of buffered hydrofluoric acid. At least a portion of the first liner 218 remains in the trenches 210, extending up to the top surface 204 of the substrate 202, due to the lower etch rate of the first liner 218 in the buffered hydrofluoric acid solution than the second liner 220. The wet etch to remove the second liner 220 may be a timed etch process, to remove the second liner 220 where exposed by the shield 214, while reducing etching of the second liner 220 between the shield 214 and the first liner 218. Forming the second liner 220 to have an etch rate at least twice that of the first liner 218 may advantageously enable complete removal of the second liner 220 where exposed by the shield 214 while leaving a continuous portion of the first liner 218 on the semiconductor material 208 in the trenches 210, preventing erosion of the semiconductor material 208. The process of removing the second liner 220 where exposed by the shield 214 may result in grooves 250 in the second liner 220 along the angled surface 234 of the contact portion 232 of the shield 214, between the contact portion 232 and the first liner 218, as depicted in FIG. 2F. The grooves 250 may expose edges of the contact portion 232 of the shield 214 along the angled surface 234. These edges may be difficult to electrically isolate from a subsequently-formed gate 222, shown in FIG. 2N, by a subsequently-formed gate dielectric layer 228, shown in FIG. 2L, alone.

Referring to FIG. 2G, a conformal layer 252 is formed over the top dielectric layer 238 and the top surface 204 of the substrate 202, extending into the trenches 210 and covering the shield 214, including the angled surface 234 of the contact portion 232 of the shield 214. The conformal layer 252 fills in the grooves 250 of FIG. 2F in the second liner 220 along the angled surface 234 of the contact portion 232 of the shield 214. The conformal layer 252 includes primarily silicon dioxide, and is formed, in this example, by a thermal CVD process using TEOS, such as an SACVD process or an APCVD process, or a PECVD process using TEOS, at a temperature sufficiently low so that the conformal layer 252 has an etch rate, in aqueous buffered hydrofluoric acid, that is at least twice an etch rate, in the same aqueous buffered hydrofluoric acid, of the first liner 218. By way of example, the conformal layer 252 may be formed at approximately 600° C. The conformal layer 252 is formed to be conformal in the trenches 210, that is, an average thickness of the conformal layer 252 on angled surfaces of the trenches 210 is 50 percent to 125 percent of an average thickness of the conformal layer 252 on horizontal surfaces in the trenches 210.

Referring to FIG. 2H, an isolation etch mask 254 is formed over the conformal layer 252. The isolation etch mask 254 extends over the contact portion 232 of the shield 214 and into the trenches 210 past the angled surface 234 of the contact portion 232. The isolation etch mask 254 does not cover the shield 214 throughout the trenches 210. The isolation etch mask 254 may extend over the shield 214 past the angled surface 234 a lateral distance of 1 micron to 5 microns, for example, to allow for undercut of the conformal layer 252 while maintaining complete coverage of the angled surface 234. The isolation etch mask 254 may include photoresist, and may be formed by a photolithographic process. Alternatively, the isolation etch mask 254 may include a polymer, and may be formed by an additive process, such as an ink jet process or a material extrusion process.

Referring to FIG. 2I, the conformal layer 252 of FIG. 2H is removed where exposed by the isolation etch mask 254 to form a shield isolation layer 236 of the conformal layer 252 covered by the isolation etch mask 254. The conformal layer 252 may be removed by a wet etch using an aqueous solution of buffered hydrofluoric acid, for example a 1 percent solution of buffered hydrofluoric acid. The conformal layer 252 may be removed by a wet etch similar to that used to remove a portion of the second liner 220 as disclosed in reference to FIG. 2F. The process of removing the conformal layer 252 is performed so as to leave at least a portion of the first liner 218 in the trenches 210, extending up to the top surface 204 of the substrate 202, due to the lower etch rate of the conformal layer 252 in the buffered hydrofluoric acid solution than the second liner 220. The wet etch to remove the conformal layer 252 may be a timed etch process, to reduce undercut of the conformal layer 252 and to reduce etching of the second liner 220 between the shield 214 and the first liner 218. Forming the conformal layer 252 to have an etch rate at least twice that of the first liner 218 may advantageously enable complete removal of the conformal layer 252 where exposed by the isolation etch mask 254 while leaving a continuous portion of the first liner 218 on the semiconductor material 208 in the trenches 210, preventing erosion of the semiconductor material 208.

Referring to FIG. 2J, the isolation etch mask 254 of FIG. 2I is removed. The isolation etch mask 254 may be removed by an oxygen plasma process followed by a wet clean process, such as the process described for removal of the shield etch mask 248, disclosed in reference to FIG. 2F.

The shield isolation layer 236 may optionally be heated after the isolation etch mask 254 is removed, to reduce an etch rate of the shield isolation layer 236 in an aqueous solution of buffered hydrofluoric acid, prior to removing the first liner 218 where exposed by the second liner 220 and the shield isolation layer 236. For example, the shield isolation layer 236 may be heated to 800° C. to 900° C., for 5 minutes to 60 minutes. Alternatively, formation of the semiconductor device 200 may be continued without heating the shield isolation layer 236.

The shield isolation layer 236 covers the angled surface 234 of the contact portion 232 of the shield 214, and extends into the grooves in the second liner 220 along the angled surface 234 of the contact portion 232 of the shield 214. The shield isolation layer 236 may be formed to extend laterally on the shield 214 for a distance sufficient to provide complete coverage of the angled surface 234.

Referring to FIG. 2K, the first liner 218 is removed in the trenches 210 where exposed by the second liner 220 and by the shield isolation layer 236. The first liner may be removed by an aqueous solution of buffered hydrofluoric acid, which may also remove a portion of the second liner 220 and a portion of the shield isolation layer 236. The top surface 204 of the substrate 202 may remain covered by silicon dioxide after the first liner 218 is removed in the trenches 210, as depicted in FIG. 2K. Alternatively, removal of the first liner 218 in the trenches 210 may result in removal of silicon dioxide from a portion or all of the top surface 204 where exposed by the shield isolation layer 236 and the top dielectric layer 238. Forming the first liner 218 to be thinner than the second liner 220 and thinner than the shield isolation layer 236 may advantageously enable removal of the first liner 218 without significant degradation of the second liner 220 and the shield isolation layer 236.

Referring to FIG. 2L, a gate dielectric layer 228 is formed on the semiconductor material 208 in the trenches 210 where exposed by the first liner 218. The gate dielectric layer 228 may be formed by a thermal oxidation process, and may have a thickness of 5 nanometers to 500 nanometers, for example. Other methods for forming the gate dielectric layer 228 are within the scope of this example. Forming the gate dielectric layer 228 may result in forming a dielectric layer, not shown in FIG. 2L, on the shield 214 in the trenches 210.

Referring to FIG. 2M, a lateral insulator 226 may be formed over the shield 214 in the trenches 210. The lateral insulator 226 electrically isolates the shield 214 from a subsequently-formed gate 222, shown in FIG. 2N.

Referring to FIG. 2N, the gate 222 is formed in the trenches 210, contacting the gate dielectric layer 228. The gate 222 may include polycrystalline silicon, and may be formed by thermal or plasma decomposition of silane or disilane, for example. The gate 222 may be formed by a process similar to that used to form the shield 214. The gate 222 is isolated from the contact portion 232 of the shield 214 by the shield isolation layer 236. The shield isolation layer 236 may limit a low leakage current between the gate 222 and the shield 214 to a desired value during operation of the MOS transistor 212. Formation of the semiconductor device 200 is continued by forming a source, body, drain contact region, and contacts, not shown in FIG. 2N, to provide a structure similar to the semiconductor device 100 of FIG. 1.

Figure 3A:
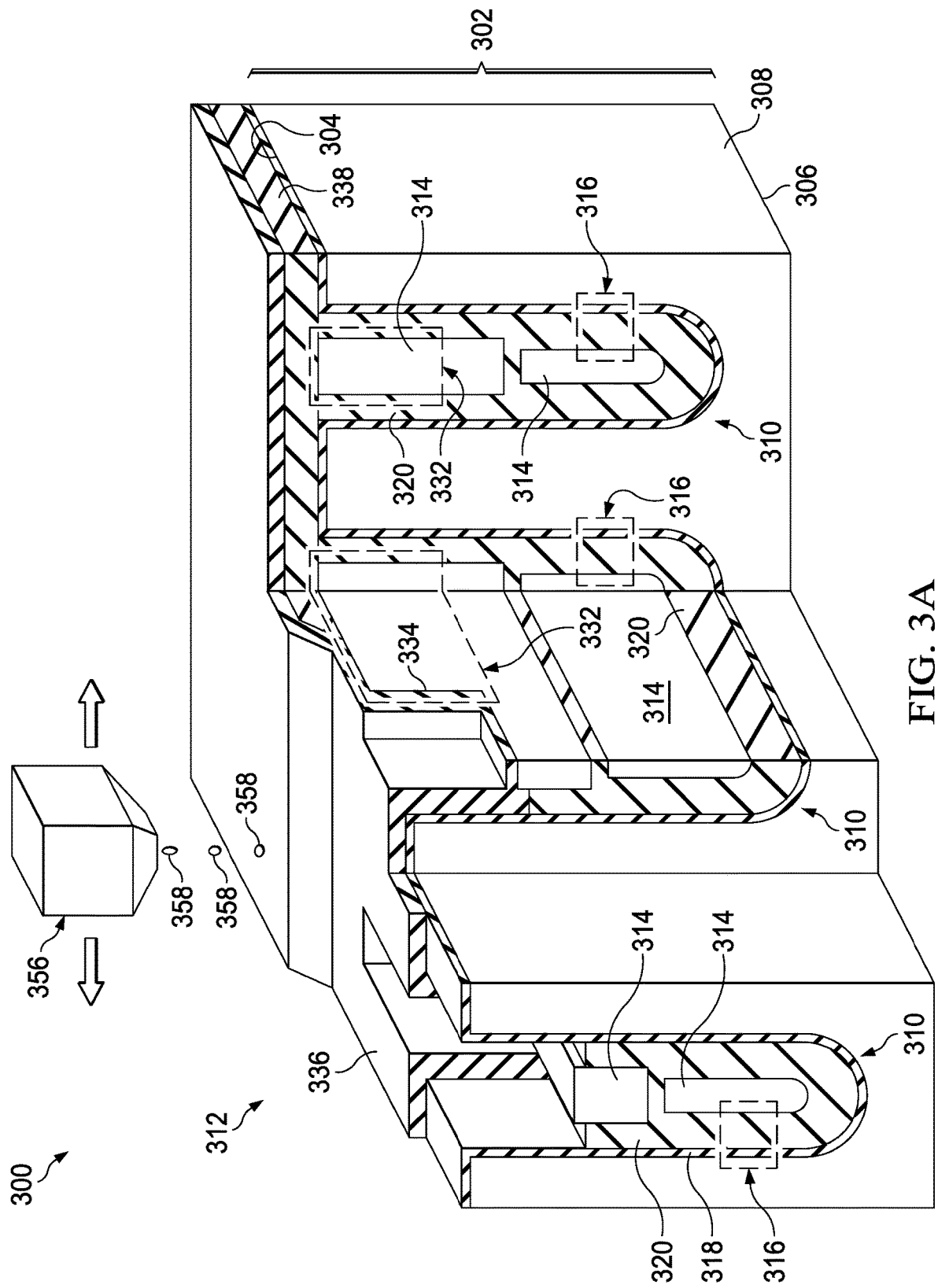
FIG. 3A and FIG. 3B are cross sections of a semiconductor device with a shield and a gate separated by a shield isolation layer, depicted in stages of another example method of formation.
Figure 3B:
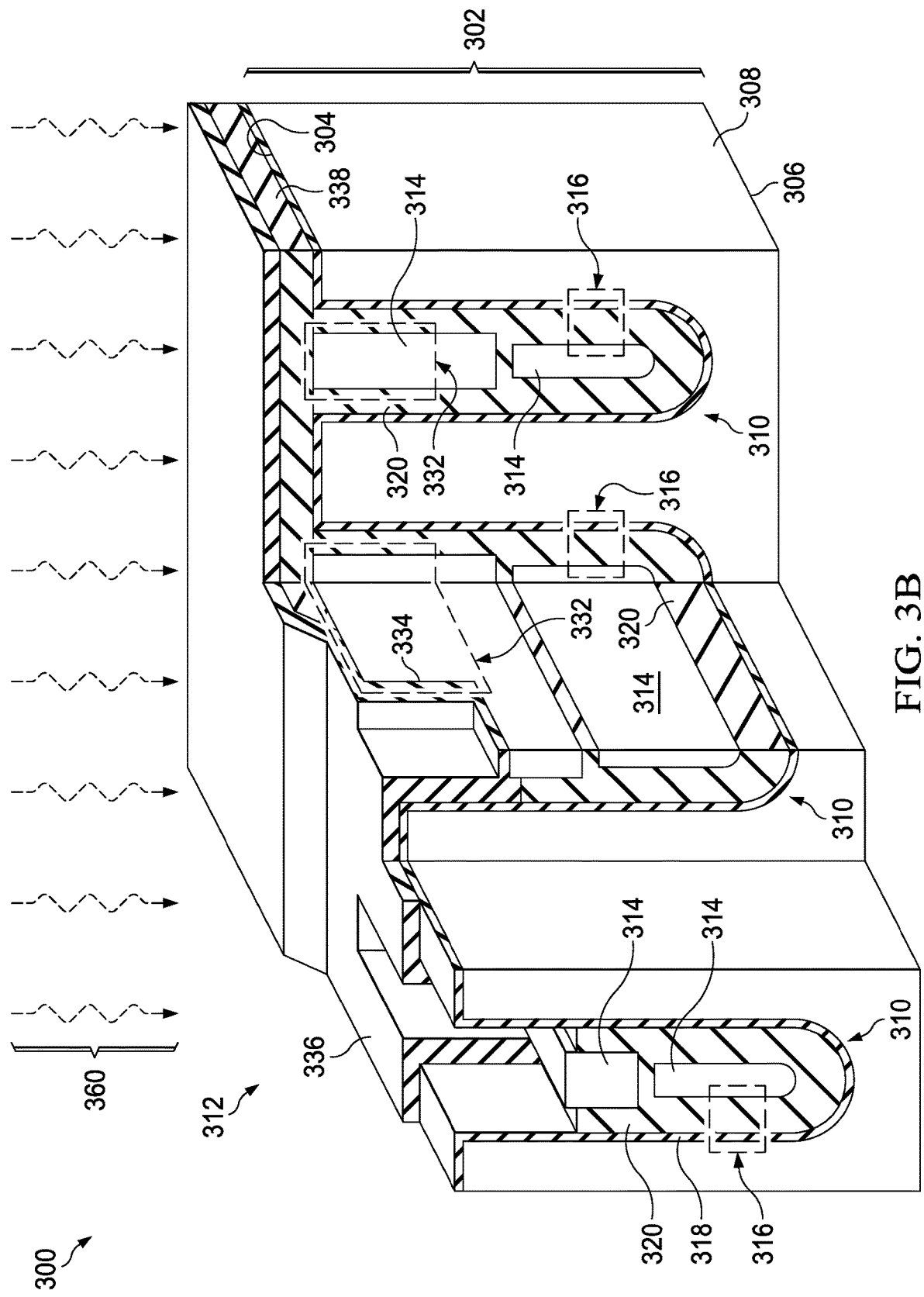

FIG. 3A and FIG. 3B are cross sections of a semiconductor device with a shield and a gate separated by a shield isolation layer, depicted in stages of another example method of formation. Referring to FIG. 3A, the semiconductor device 300 is formed in and on a substrate 302 having a top surface 304 and a bottom surface 306 located opposite from the top surface 304, and a semiconductor material 308 between the top surface 304 and the bottom surface 306. One or more trenches 310 are formed in the substrate 302 in an area for an MOS transistor 312. The trenches 310 extend into the semiconductor material 308 from the top surface 304. A shield liner 316 is formed in the trenches 310, including a first liner 318 and a second liner 320. A shield 314 is formed in the trenches 310; in this example, the shield 314 may include two or more separate pieces, arranged vertically in the trenches 310. A contact portion 332 of the shield 314 extends to proximate to the top surface 304, while a remainder of the shield 314 is recessed vertically in the trenches 310 from the top surface 304, to allow room for a subsequently-formed gate in the trenches 310. The contact portion 332 of the shield 314 has an angled surface 334 that is exposed in the trenches 310. A top dielectric layer 338 may be formed over the top surface 304 outside of the trenches 310, as depicted in FIG. 3A.

In this example, a shield isolation layer 336 is formed on the angled surface 334 by an additive process. For the purposes of this disclosure, an additive process may be understood to dispose nanoparticles in an area for the shield isolation layer 336, and not dispose the nanoparticles outside of the area for the shield isolation layer 336, so that it is not necessary to remove a portion of the disposed nanoparticles to produce a final desired shape of the shield isolation layer 336. Additive processes may enable forming films in desired areas without photolithographic processes and subsequent etch processes, thus advantageously reducing fabrication cost and complexity. Examples of additive processes include binder jetting, material jetting, directed energy deposition, material extrusion, powder bed fusion, sheet lamination, vat photopolymerization, direct laser deposition, electrostatic deposition, laser sintering, electrochemical deposition, cold spraying, thermal spraying, and photo-polymerization extrusion. By way of example, the additive process may use an ink jet apparatus 356 to dispense a dielectric precursor 358 onto the semiconductor device 300. In one example, the dielectric precursor 358 may include nanoparticles of silicon dioxide, in a liquid binder including TEOS. In another example, the dielectric precursor 358 may include nanoparticles of silicon dioxide, silicon nitride, aluminum oxide, titanium dioxide, or other dielectric material, in a solvent binder. The dielectric precursor 358 may include materials which have a low etch rate in aqueous buffered hydrofluoric acid, such as silicon nitride, to reduce degradation of the shield isolation layer 336 during subsequent removal of the first liner 318. The shield isolation layer 336 may be formed to extend over the top dielectric layer 338 to a lateral perimeter of the semiconductor device 300, as indicated in FIG. 3A. Alternatively, the shield isolation layer 336 may be formed to extend partway onto the top dielectric layer 338, similar to the shield isolation layer 236 of FIG. 2N.

Referring to FIG. 3B, the shield isolation layer 336 is heated to remove volatile material such as binders or solvents, and to adhere nanoparticles in the shield isolation layer 336 to each other. The shield isolation layer 336 may be heated by a radiant heating process 360, as depicted schematically in FIG. 3B. Alternatively, the shield isolation layer 336 may be heated by a furnace process, a forced air convection heating process, or a hot plate process. Formation of the semiconductor device 300 is continued as disclosed in reference to FIG. 2K through FIG. 2N.

Various features of the examples disclosed herein may be combined in other manifestations of example semiconductor devices. For example, the MOS transistor 112 of FIG. 1 may have a single part shield similar to the shield 214 of FIG. 2B or a multiple part shield similar to the shield 314 of FIG. 3A. The MOS transistor 112 of FIG. 1 may have a shield isolation layer similar to the shield isolation layer 236 of FIG. 2J or the shield isolation layer 336 of FIG. 3A.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a semiconductor device, comprising:
   acquiring a substrate having a top surface and a bottom surface located opposite from the top surface, the substrate having a semiconductor material between the top surface and the bottom surface;
   forming a trench in the substrate into the semiconductor material from the top surface;
   forming a shield liner in the trench on a surface of the semiconductor material, the shield liner being electrically non-conductive;
   forming a shield of a metal oxide semiconductor (MOS) transistor in the trench on the shield liner, the shield being electrically conductive;
   removing a portion of the shield from the trench from the top to form a recessed portion adjacent a contact portion, the contact portion having an angled surface extending toward the top surface of the substrate from the recessed portion;
   forming a shield isolation layer on the shield, the shield isolation layer covering the angled surface of the contact portion of the shield, the shield isolation layer being electrically non-conductive, wherein the shield isolation layer does not extend the length of the recessed portion of the shield in the trench;
   forming a gate dielectric layer of the MOS transistor in the trench on the semiconductor material; and
   forming a gate of the MOS transistor in the trench over the recessed portion of the shield, the gate contacting the gate dielectric layer, the gate being separated from the angled surface of the contact portion of the shield by the shield isolation layer.

2. The method of claim 1, wherein forming the shield isolation layer includes forming a conformal layer covering the angled surface of the contact portion of the shield, the conformal layer being electrically non-conductive.

3. The method of claim 2, wherein forming the shield isolation layer includes forming an etch mask over the conformal layer.

4. The method of claim 3, wherein forming the shield isolation layer includes removing the conformal layer where exposed by the etch mask using aqueous buffered hydrofluoric acid.

5. The method of claim 1, wherein forming the shield liner includes forming a first liner on the semiconductor material by a thermal oxidation process.

6. The method of claim 5, wherein forming the shield liner includes forming a second liner on the first liner using a thermal chemical vapor deposition (CVD) process using tetraethyl orthosilicate (TEOS).

7. The method of claim 1, wherein forming the shield isolation layer leaves a portion of the shield liner in the trench on the semiconductor material.

8. The method of claim 1, further including removing at least a portion of the shield liner from the trench where exposed by the shield, after removing the portion of the shield from the trench, and prior to forming the shield isolation layer.

9. The method of claim 1, wherein forming the shield isolation layer includes heating the shield isolation layer at a temperature above 800° C.

10. The method of claim 9, wherein heating the shield isolation layer is performed concurrently with forming the gate dielectric layer.

11. The method of claim 1, wherein forming the gate includes forming polycrystalline silicon in the trench on the gate dielectric layer.

12. The method of claim 1, wherein:
removing the portion of the shield liner forms a groove along the angled surface, between the contact portion of the shield and the semiconductor material; and
forming the shield isolation layer fills the groove with dielectric material.

13. The method of claim 1, wherein forming the shield isolation layer is performed using an additive process.

14. A method of forming a semiconductor device, comprising:
forming a trench in a semiconductor material of a substrate;
forming a shield liner in the trench;
forming a shield in the trench on the shield liner, the shield being electrically conductive;
removing a portion of the shield to create a recessed portion adjacent a contact portion of the shield;
forming a shield isolation layer on the shield, the shield isolation layer covering the recessed portion and the contact portion of the shield, the shield isolation layer being electrically non-conductive;
removing a portion of the shield isolation layer, wherein the shield isolation layer does not extend the length of the recessed portion of the shield;
forming a gate dielectric layer in the trench; and
forming a gate in the trench, the gate contacting the gate dielectric layer, the gate being separated from the contact portion of the shield by the shield isolation layer.

15. The method of claim 14, wherein the gate dielectric contacts the shield where the portion of the shield isolation layer was removed and the gate contacts the gate dielectric layer including over where the portion of the shield isolation layer was removed.

16. The method of claim 14, removing the portion of the shield isolation layer comprises:
forming a mask layer over the shield isolation layer, the mask covering the contact portion of the shield and extending past the contact portion of the shield over the recessed portion a lateral distance beyond which the shield isolation layer over the recessed portion is exposed;
etching the shield isolation layer where exposed by the mask layer; and
removing the mask layer.

17. The method of claim 16, wherein the lateral distance is 1 micron to 5 microns.

18. A method of forming a semiconductor device, comprising:
forming a trench in a semiconductor material of a substrate;
forming a shield in the trench;
removing a portion of the shield to create a recessed portion adjacent a contact portion of the shield;
forming a shield isolation layer on the shield, the shield isolation layer covering the recessed portion and the contact portion of the shield;
removing a portion of the shield isolation layer over a sub-portion of the recessed portion, wherein the shield isolation layer covers a sidewall of the contact portion and does not extend the length of the recessed portion of the shield;
forming a gate dielectric layer in the trench; and
forming a gate in the trench, the gate contacting the gate dielectric layer, the gate being separated from the contact portion of the shield by the shield isolation layer.

* * * * *